United States Patent
Berscheid et al.

(10) Patent No.: US 10,003,324 B2
(45) Date of Patent: Jun. 19, 2018

(54) FAST FIR FILTERING TECHNIQUE FOR MULTIRATE FILTERS

(71) Applicant: Vecima Networks Inc., Victoria (CA)

(72) Inventors: Brian Berscheid, Victoria (CA); Aroutchelvame Mayilavelane, Victoria (CA)

(73) Assignee: VECIMA NETWORKS INC., Victoria (CA)

( * ) Notice: Subject to any disclaimer, the term of this patent is extended or adjusted under 35 U.S.C. 154(b) by 176 days.

(21) Appl. No.: 14/799,950

(22) Filed: Jul. 15, 2015

(65) Prior Publication Data

US 2016/0079960 A1 Mar. 17, 2016

Related U.S. Application Data

(60) Provisional application No. 62/051,555, filed on Sep. 17, 2014.

(51) Int. Cl.
*H03H 17/06* (2006.01)
*H03H 17/02* (2006.01)

(52) U.S. Cl.
CPC .... *H03H 17/0621* (2013.01); *H03H 17/0275* (2013.01); *H03H 2017/0247* (2013.01)

(58) Field of Classification Search
None
See application file for complete search history.

(56) References Cited

U.S. PATENT DOCUMENTS

2015/0088951 A1* 3/2015 Torosyan ............... G06F 17/14
708/300

* cited by examiner

*Primary Examiner* — Michael D. Yaary
(74) *Attorney, Agent, or Firm* — Slayden Grubert Beard PLLC

(57) ABSTRACT

Data samples are filtered by using a digital filter where the length of an impulse response of the digital filter is finite, an impulse response of the digital filter is symmetric and the operation of the digital filter is multi-rate. The method uses a polyphase decomposition to break down the input data stream into N parallel substreams and the multi-rate digital filter is separated by a polyphase decomposition into multiple lower-rate sub-filters where each of the sub-filters is separated into a set of simpler sub-sub-filters which operate upon the same set of input samples and which have impulse responses which are jointly centro-symmetric, a set of pre-filtering arithmetic structures, and a set of post-filtering arithmetic structures and performing each such pair of sub-sub-filtering operations using a single shared filter structure, a set of pre-filtering combining adders, and a set of post-filtering separating adders.

15 Claims, 10 Drawing Sheets

☐ : LxL T&C FFA preadder structure
☐ : LxL Standard FFA preadder structure
◯ : LxL T&C FFA postadder structure
◯ : LxL Standard FFA postadder structure

| FFA Type | 2x2 | 3x3 |
|---|---|---|
| Standard, non-tranposed | 1 (3) | 3 (7) |
| Standard, transposed | 2 (2) | 4 (6) |
| T&C, non-transposed | 2 (4) | 5 (12) |
| T&C, transposed | 3 (3) | 9 (8) |

FIG. 7

| M | L | N | Multipliers | | Adders | | | | | | Resources Saved | |
|---|---|---|---|---|---|---|---|---|---|---|---|---|
| | | | Parallel | Proposed | Parallel | | | Proposed | | | Multipliers | Adders |
| | | | | | Post | Subfilters | Total | Pre/post | Subfilters | Total | | |
| ↑2 | 2 | 120 | 120 | 120 | 4 | 232 | 236 | 9 | 178 | 187 | 0 | 49 (1) |
| ↑2 | 3 | 120 | 180 | 160 | 12 | 342 | 354 | 25 | 236 | 261 | 20 | 93 (4) |
| ↑2 | 4 | 120 | 240 | 210 | 24 | 448 | 472 | 42 | 260 | 302 | 30 | 170 (5) |
| ↑2 | 6 | 120 | 360 | 280 | 60 | 648 | 708 | 93 | 340 | 433 | 80 | 275 (12) |
| ↑2 | 8 | 120 | 480 | 345 | 112 | 832 | 944 | 150 | 367 | 517 | 135 | 427 (19) |
| ↑4 | 2 | 120 | 120 | 120 | 8 | 224 | 232 | 15 | 176 | 191 | 0 | 41 (3) |
| ↑4 | 3 | 120 | 180 | 160 | 24 | 324 | 348 | 41 | 232 | 273 | 20 | 75 (12) |
| ↑4 | 4 | 120 | 240 | 210 | 48 | 416 | 464 | 70 | 250 | 320 | 30 | 144 (15) |
| ↑4 | 6 | 120 | 360 | 280 | 120 | 576 | 696 | 155 | 320 | 475 | 80 | 221 (36) |
| ↑4 | 8 | 120 | 480 | 345 | 224 | 704 | 928 | 250 | 329 | 579 | 135 | 349 (57) |
| ↑6 | 2 | 120 | 120 | 120 | 12 | 216 | 228 | 21 | 174 | 195 | 0 | 33 (5) |
| ↑6 | 3 | 120 | 180 | 160 | 36 | 306 | 342 | 57 | 228 | 285 | 20 | 57 (20) |
| ↑6 | 4 | 120 | 240 | 210 | 72 | 384 | 456 | 98 | 240 | 338 | 30 | 118 (25) |
| ↑6 | 6 | 120 | 360 | 280 | 180 | 504 | 684 | 217 | 300 | 517 | 80 | 167 (60) |
| ↑6 | 8 | 120 | 480 | 345 | 336 | 576 | 912 | 350 | 291 | 641 | 135 | 271 (95) |

FIG. 8

FAST FIR FILTERING TECHNIQUE FOR MULTIRATE FILTERS

This application claims the benefit of priority under 35 USC 119 (e) of Provisional Application 62/051,555 filed Sep. 9, 2014.

This invention relates to a method for filtering data samples using a digital filter to act upon an input data stream in order to transform it into an output data stream, where the length of an impulse response of the digital filter is finite, the impulse response of the digital filter is symmetric and the operation of the digital filter is multi-rate.

BACKGROUND OF THE INVENTION

The following references are related to this field and may provide information relevant to the subject matter herein so that the disclosures of each of the following documents are incorporated herein by reference:

[1] A. Oppenheim and R. Schafer, *Discrete-Time Signal Processing*. Pearson Education, 2011.
[2] F. Van de Sande, N. Lugil, F. Demarsin, Z. Hendrix, A. Andries, P. Brandt, W. Anklam, J. Patterson, B. Miller, M. Rytting, M. Whaley, B. Jewett, J. Liu, J. Wegman, and K. Poulton, "A 7.2 gsa/s, 14 bit or 12 gsa/s, 12 bit signal generator on a chip in a 165 ghz ft bicmos process," *Solid-State Circuits, IEEE Journal of*, vol. 47, no. 4, pp. 1003-1012, 2012.
[3] M.-J. Choe, Kwang-Hyun-Baek, and M. Teshome, "A 1.6-gs/s 12-bit return-to-zero gaas rf dac for multiple nyquist operation," *Solid-State Circuits, IEEE Journal of*, vol. 40, no. 12, pp. 2456-2468, 2005.
[4] J. Xiao, B. Chen, T. Y. Kim, N.-Y. Wang, X. Chen, T.-H. Chih, K. Raviprakash, H.-F. Chen, R. Gomez, and J. Chang, "A 13-bit 9 gs/s rf dac-based broadband transmitter in 28 nm cmos," in *VLSI Circuits (VLSIC)*, 2013 Symposium on, 2013, pp. C262-C263.
[5] B. Mohr, N. Zimmermann, B. Thiel, J. Mueller, Y. Wang, Y. Zhang, F. Lemke, R. Leys, S. Schenk, U. Bruening, R. Negra, and S. Heinen, "An rfdac based reconfigurable multi-standard transmitter in 65 nm cmos," in *Radio Frequency Integrated Circuits Symposium (RFIC)*, 2012 IEEE, 2012, pp. 109-112.
[6] K. Parhi, *VLSI Digital Signal Processing Systems: Design and Implementation*. Wiley, 1999.
[7] Z.-J. Mou and P. Duhamel, "Short-length fir filters and their use in fast nonrecursive filtering," *Signal Processing, IEEE Transactions on*, vol. 39, no. 6, pp. 1322-1332, 1991.
[8] C. Cheng and K. Parhi, "Hardware efficient fast parallel fir filter structures based on iterated short convolution," *Circuits and Systems I: Regular Papers, IEEE Transactions on*, vol. 51, no. 8, pp. 1492-1500, 2004.
[9] Y.-C. Tsao and K. Choi, "Area-efficient parallel fir digital filter structures for symmetric convolutions based on fast fir algorithm," *Very Large Scale Integration (VLSI) Systems, IEEE Transactions on*, vol. 20, no. 2, pp. 366-371, 2012.
[10] Z.-J. Mou and P. Duhamel, "A unified approach to the fast fir filtering algorithms," in *Acoustics, Speech, and Signal Processing, 1988. ICASSP-88*, 1988 International Conference on, 1988, pp. 1914-1917 vol. 3.
[11] I.-S. Lin and S. Mitra, "Fast fir filtering algorithms based on overlapped block structure," in *Circuits and Systems, 1993, ISCAS '93, 1993 IEEE International Symposium on*, 1993, pp. 363-366 vol. 1.
[12] C. Cheng and K. Parhi, "Low-cost parallel fir filter structures with 2-stage parallelism," *Circuits and Systems I: Regular Papers, IEEE Transactions on*, vol. 54, no. 2, pp. 280-290, 2007.
[13] Y.-C. Tsao and K. Choi, "Area-efficient vlsi implementation for parallel linear-phase fir digital filters of odd length based on fast fir algorithm," *Circuits and Systems II: Express Briefs, IEEE Transactions on*, vol. 59, no. 6, pp. 371-375, 2012.
[14] R. Crochiere and L. Rabiner, *Multirate digital signal processing*. Prentice Hall, 1983.
[15] Z.-J. Mou, "Symmetry exploitation in digital interpolators/decimators," *Signal Processing, IEEE Transactions on*, vol. 44, no. 10, pp. 2611-2615, 1996.

Finite impulse response (FIR) filters are commonly used in digital communication systems to perform a number of operations, including channel shaping or matched filtering, channel up/downconversion, channel synchronization, RF pre-distortion, and adaptive equalization. As a result, there has been a significant amount of research into methods of implementing FIR filters in FPGAs, ASICs and DSP processors (henceforth "FPGAs"). Over the years, a number of efficient techniques and structures have been identified and are now widely known to the industrial and academic communities [1].

Due to recent advances in RF integrated circuit technology, a current trend in the industry is to use wideband digital-to-analog and analog-to-digital converters to digitize or output large (up to multiple GHz) blocks of RF spectrum [2]-[5]. While this is very convenient from a system perspective, the higher sampling rates necessitated by these wideband signals place a significant computational burden upon the FPGA which processes the digital signal. In many applications, the required sampling rate of the digital signal exceeds the maximum clock frequency of the FPGA, which means that many traditional FIR filter structures are not directly applicable.

The straightforward method of handling this scenario is to construct a so-called parallel FIR filter, in which the high frequency input data is represented as L parallel streams, where L is the ratio of the sampling frequency to the FPGA clock frequency. The original prototype filter is decomposed into a set of $L^2$ subfilters which are applied to the incoming parallel data. The outputs of these subfilters are then combined in order to generate L parallel output data streams [6]. The downside of the parallel FIR approach is its cost, which increases linearly with L. As the required sampling frequency increases, the number of parallel data streams becomes large, which can render even modest filtering operations computationally expensive. Consequently, there has been renewed interest in structures for the implementation of high-speed FIR filters in recent years [6]-[13].

One such structure is known as the Fast FIR Algorithm (FFA), described in detail in [6], [7], and [10]. The FFA decomposes the parallel filtering operation in a manner which allows some of the subfilters to be replaced with pre- and post-adders. This reduces the number of multiplications required to perform the filtering operation at the cost of extra additions—an advantageous tradeoff because the hardware cost of adders is typically much less than that of multipliers.

One downside of the standard FFA algorithm is that it is not well-suited to the case where the filter coefficients are symmetrical. Under normal circumstances, the number of multiplications required for a symmetrical filter may be cut in half by adding the common terms before multiplying. However, when the FFA is applied to a symmetrical filter, most of the FFA's subfilters are not symmetrical, thereby negating much of the benefit of the FFA. To address this deficiency, Tsao and Choi (T&C) proposed a modified FFA which is better-suited to symmetrical filters [9]. By changing the method used to construct the subfilters, T&C were able to generate a structure in which a higher proportion of the subfilters have symmetrical coefficients, resulting in a lower computational cost for symmetrical filters than the traditional FFA.

However, the T&C FFA was designed to handle only single rate FIR filters. The algorithm cannnot be directly applied to multirate filters, such as the high-rate interpolators and decimators which are needed to convert to and from the RF sampling frequency in modern systems. As a result, this critical filtering stage is typically relatively expensive in modern systems. In this paper, a technique for reducing the computational complexity of multirate filters through the use of the T&C FFA is presented. This technique is applicable to all multirate filters, but is particularly useful for high speed interpolators and decimators.

The output of a single-rate N-tap FIR filter with filter coefficients $h_i$ for an infinite length input sequence $x_n$ is expressed as $$y_n = \sum_{i=0}^{N-1} h_i x_{n-i}, \qquad (1)$$
$$n = 0, 1, 2, \ldots$$

Unlike the single-rate filter of equation 1, an L-parallel FIR filter receives L input samples every clock cycle. Such an L-parallel filter can be expressed using a polyphase decomposition as given below $$\sum_{i=0}^{L-1} Y_i(z^L) z^{-i} = \sum_{j=0}^{L-1} X_j(z^L) z^{-j} \sum_{k=0}^{L-1} H_k(z^L) z^{-k} \text{ where} \qquad (2)$$

$$X_j = \sum_{p=0}^{\infty} z^{-p} x_{Lp+j}, H_k = \sum_{p=0}^{\frac{N}{L}-1} z^{-p} h_{Lp+k} \text{ and}$$

$$Y_i = \sum_{p=0}^{\infty} z^{-p} y(Lp+i)$$

for i, j, k=0, 1, 2, ..., L−1. For example, the standard 2-by-2 FFA described in [6] receives two input samples each clock cycle, as shown in FIG. 1a. This filter may be expressed mathematically as $$Y = Y_0 + z^{-1} Y_1 = (H_0 + z^{-1} H_1)(X_0 + z^{-1} X_1) \qquad (3)$$
$$= \{H_0 X_0 + z^{-2} H_1 X_1\} + z^{-1}\{H_0 X_1 + H_1 X_0\}$$
$$= \{H_0 X_0 + z^{-2} H_1 X_1\} +$$
$$z^{-1}\{(H_0 + H_1)(X_0 + X_1) - H_0 X_0 - H_1 X_1\}$$

The filter of equation (3) can be represented in matrix form as given below.

(4) $\quad y_2 = q_{s,2} \times g_{s,2} \times h_{s,2} \times p_{s,2} \times x_2$ where $$p_{s,2}^T = \begin{bmatrix} 1 & 1 & 0 \\ 0 & 1 & 1 \end{bmatrix},$$

$$q_{s,2} = \begin{bmatrix} 1 & 0 & D \\ -1 & 1 & -1 \end{bmatrix},$$

$D=z^{-1}$, $g_{s,2}=I_3$, which is the 3×3 identity matrix, $h_{s,2}=p_{s,2} \times [H_0 \ H_1]^T$, $y_2=[Y_0 \ Y_1]^T$, and $x_2=[X_0 \ X_1]^T$. Note that in this paper, the superscript $^T$ denotes transposition of a matrix and the subscript $_s$ indicates that the matrix in question refers to a standard FFA.

From equation (4), it is apparent that an implementation of the 2-by-2 standard FFA requires 3 subfilters (from subfilter matrix $h_{s,2}$), one pre-adder (from pre-add matrix $p_{s,2}$), and three post-adders (from post-add matrix $q_{s,2}$). Assuming a symmetrical original prototype filter, only one of the FFA subfilters ($H_0+H_1$) is symmetrical.

In [9], T&C presented an alternate 2-by-2 FFA which is specifically defined for the case of a symmetrical prototype filter. The 2-by-2 T&C FFA, which is shown in FIG. 1b, is mathematically expressed as $$Y = \{1/2[(H_0 + H_1)(X_0 + X_1) + (H_0 - H_1)(X_0 - X_1)] - \qquad (5)$$
$$H_1 X_1 + z^{-2} H_1 X_1\} +$$
$$z^{-1}\{1/2[(H_0 + H_1)(X_0 + X_1) - (H_0 - H_1)(X_0 - X_1)]\}$$

Equation 5 may be expressed in matrix form as $$y_2 = q_{c,2} \times g_{c,2} \times h_{c,2} \times p_{c,2} \times x_2 \qquad (6)$$

where $$p_{c,2}^T = \begin{bmatrix} 1 & 1 & 0 \\ 1 & -1 & 1 \end{bmatrix},$$

$$q_{c,2} = \begin{bmatrix} 1 & 1 & (-1+D) \\ 1 & -1 & 0 \end{bmatrix},$$

$g_{c,2}$=diag[½ ½ 1], and $h_{c,2}=p_{c,2} \times [H_0 \ H_1]^T$. In this paper, diagonal matrices such as $g_{c,2}$ are represented using the notation diag[rowval], where rowval is the set of values on the main diagonal. The subscript $_c$ is used to indicate that a matrix belongs to a T&C FFA.

Equation 6 indicates that an implementation of the 2-by-2 T&C FFA requires 3 subfilters, two pre-adders, and four post-adders, which is an increase of two adders compared to the standard FFA. However, two of the FFA subfilters, ($H_0+H_1$) and ($H_0-H_1$), are symmetrical.

Similarly, the matrix forms of the 3-by-3 standard and T&C FFAs are given in equations (7) and (8), respectively.

$$y_3 = q_{s,3} \times g_{s,3} \times h_{s,3} \times p_{s,3} \times x_3 \qquad (7)$$

where $$p_{s,3}^T = \begin{bmatrix} 1 & 0 & 0 & 1 & 0 & 1 \\ 0 & 1 & 0 & 1 & 1 & 1 \\ 0 & 0 & 1 & 0 & 1 & 1 \end{bmatrix},$$

-continued $$q_{s,3} = \begin{bmatrix} 1 & -D & -D & 0 & D & 0 \\ -1 & -1 & D & 1 & 0 & 0 \\ 0 & 2 & 0 & -1 & -1 & 1 \end{bmatrix},$$

$g_{s,3}=I_6$, $h_{s,3}=p_{s,3}\times[H_0 H_1 H_2]^T$, $y_3=[Y_0\ Y_1\ Y_2]^T$, and $x_3=[X_0\ X_1\ X_2]^T$.

$$y_3 = q_{c,3} \times g_{c,3} \times h_{c,3} \times p_{c,3} \times x_3 \quad (8)$$

where $$p_{c,3}^T = \begin{bmatrix} 1 & 1 & 0 & 1 & 1 \\ 1 & -1 & 1 & 1 & 0 & 0 \\ 0 & 0 & 0 & 1 & 1 & -1 \end{bmatrix},$$

$$q_{c,3} = \begin{bmatrix} 1-D & 1+D & -1-D & D & -2D & 0 \\ 1-D & -1-D & D & 0 & D & D \\ 0 & 0 & 1 & 0 & 1 & -1 \end{bmatrix},$$

$g_{c,3}$=diag[½ ½ 1½ ½], and $h_{c,3}=p_{c,3}\times[H_0\ H_1\ H_2]^T$.

The above equations indicate that an implementation of the 3-by-3 standard FFA requires six subfilters, three pre-adders, and seven post-adders. In contrast, the 3-by-3 T&C FFA requires six subfilters, five pre-adders, and twelve post-adders. As with the 2-by-2 FFAs already discussed, the advantage of the 3-by-3 T&C FFA is that it yields a greater number of symmetrical subfilters: four, as opposed to two in the case of the standard 3-by-3 FFA.

It is possible to construct a composite L-by-L FFA by cascading multiple stages of 2-by-2 and/or 3-by-3 FFAs. In this scenario, $L=\Pi_{i=0}^{W-1} l_i$, where $l_i=2$ or 3 represents the FFA order of the i'th stage of the decomposition and W represents the total number of stages in the decomposition. To illustrate, consider decompsing an N-tap FIR filter to generate a 6-by-6 FFA. The first cascading stage applies a 2-by-2 FFA ($l_0=2$) on the FIR filter which results in three subfilters of length N/2. The second cascading stage applies a 3-by-3 FFA ($l_1=3$) to decompose each subfilter from the first stage into six subfilters, each of length N/6. Thus, the 6-by-6 FFA has a total of 18 subfilters, each of length N/6.

In general, an L-by-L standard FFA may be expressed mathematically as:

$$Y_p = Q_s H_s P_s X_p \quad (9)$$

where $X_p$ and $Y_p$ are permuted versions of $Y=[Y_0\ Y_1\ \ldots\ Y_{L-1}]T$ and $X=[X_0\ X_1\ \ldots\ X_{L-1}]^T$. The permutation process is described in detail in [6]. $P_s$, $H_s$, and $Q_s$, are general pre-add, subfilter, and post-add matrices, which are described by equations (10-12).

$$P_s = p_{s,l_0} \otimes p_{s,l_1} \otimes \ldots \otimes p_{s,l_{W-2}} \otimes p_{s,l_{W-1}} \ldots \quad (10)$$

$$H_s = \text{diag}(P_s H) \quad (11)$$

and $$H = [H_0\ H_1\ \ldots\ H_{L-1}]^T$$

$$Q_s = \prod_{i=0}^{W-1} B_{s,W-1-i}, \quad (12)$$

where $B_{s,i}$, which represents the post-add matrix at cascade stage i, is equal to $$l_{l_{F_0}} \otimes l_{l_{F_1}} \otimes \ldots\ l_{F_{l_{i-1}}} \otimes Q_{s,i}, F_i,$$

the number of subfilters generated by an $l_i$-by-$l_i$ FFA, is 3 for $l_i=2$ and 6 for $l_i=3$. $Q_{s,i}$ is an expanded version of $q_{s,l_i}$, where each element in the original matrix is replaced by an m-by-m matrix, m=L/($\Pi_{n=0}^{i} l_n$). The rules for this replacement are as follows: each 1 is replaced by $I_m$, each 0 is replaced by $0_m$, and each $z^{-1}$ is replaced by the m-unfolded version of $z^{-1}$. This type of transformation will be seen repeatedly in this paper, and will be referred to as an m-by-m delay unfolding transformation.

The L-by-L T&C FFA applies the same cascading process but uses both standard and T&C basic FFA structures. The reason both the standard and T&C basic FFA structures are used is that applying the T&C FFA on non-symmetrical filters does not produce symmetrical subfilters. Thus, there is no benefit to the additional cost of the T&C FFA when decomposing any subfilters that are not symmetrical. To minimize the overall system cost, it is prudent to use the T&C decomposition on only the symmetrical subfilters and the standard FFA decomposition on the non-symmetrical subfilters.

The literature [9] discusses the process of constructing an L-by-L T&C FFA, but does not provide an explicit mathematical model for the resulting filter. In this document, one such model is presented for the proposed FFA-based multirate architecture. This model can be easily generalized for the single rate T&C FFA.

SUMMARY OF THE INVENTION

According to a first aspect of the invention there is provided a method for filtering data samples comprising:

using a digital filter to act upon a input data stream in order to transform it into an output data stream, wherein:

the length of an impulse response of the digital filter is finite;

an impulse response of the digital filter is symmetric;

the operation of the digital filter is multi-rate;

using a polyphase decomposition to break down the input data stream into N parallel substreams;

the multi-rate digital filter being separated by a polyphase decomposition into multiple lower-rate sub-filters;

each of the sub-filters being separated one or more times into a set of simpler sub-sub-filters, a set of pre-filtering arithmetic structures, and a set of post-filtering arithmetic structures, according to a fast FIR filtering decomposition algorithm;

the set of sub-sub-filters comprising one or more pairs of sub-sub-filters which operate upon the same set of input samples and which have impulse responses which are jointly centro-symmetric;

and performing each such pair of sub-sub-filtering operations using a single shared filter structure, a set of pre-filtering combining adders, and a set of post-filtering separating adders.

Preferably the multi-rate digital filter is a digital interpolator and wherein a single pre-filtering arithmetic structure is used to generate the set of input data samples required by multiple sets of sub-sub-filters. That is multiple redundant pre-filtering arithmetic structures are simplified into a single pre-filtering arithmetic structure.

Preferably the order of the pre-filtering and post-filtering arithmetic structures is interchanged through a circuit transposition operation.

Preferably the filter is a digital decimator and a single post-filtering arithmetic structure is used to process the output samples from multiple sets of sub-sub-filters.

Preferably the order of the pre-filtering and post-filtering arithmetic structures is interchanged through a circuit transposition operation.

Preferably the fast FIR decomposition algorithm is a 2×2 decomposition as described in equation 6.

Preferably the fast FIR decomposition algorithm is a 3×3 decomposition as described in equation 8.

According to a second aspect of the invention there is provided a method for filtering data samples comprising:

using a digital filter to act upon a input data stream in order to transform it into an output data stream, wherein:

the length of an impulse response of the digital filter is finite;

an impulse response of the digital filter is symmetric;

the operation of the digital filter is multi-rate;

using a polyphase decomposition to break down the input data stream into N parallel substreams;

the multi-rate digital filter being separated by a polyphase decomposition into multiple lower-rate sub-filters;

each of the sub-filters being separated one or more times into a set of simpler sub-sub-filters, a set of pre-filtering arithmetic structures, and a set of post-filtering arithmetic structures, according to a fast FIR filtering decomposition algorithm;

wherein the multi-rate digital filter is a digital interpolator and wherein a single pre-filtering arithmetic structure is used to generate the set of input data samples required by multiple sets of sub-sub-filters.

According to a third aspect of the invention there is provided a method for filtering data samples comprising:

using a digital filter to act upon a input data stream in order to transform it into an output data stream, wherein:

the length of an impulse response of the digital filter is finite;

an impulse response of the digital filter is symmetric;

the operation of the digital filter is multi-rate;

using a polyphase decomposition to break down the input data stream into N parallel substreams;

the multi-rate digital filter being separated by a polyphase decomposition into multiple lower-rate sub-filters;

each of the sub-filters being separated one or more times into a set of simpler sub-sub-filters, a set of pre-filtering arithmetic structures, and a set of post-filtering arithmetic structures, according to a fast FIR filtering decomposition algorithm;

wherein the filter is a digital decimator and a single post-filtering arithmetic structure is used to process the output samples from multiple sets of sub-sub-filters.

BRIEF DESCRIPTION OF THE DRAWINGS

FIG. 7 is a Table 1 which indicates the number of pre-adders and post-adders required for various transposed and non-transposed FFA structures.

FIG. 8 is a Table 2 which compares the computational complexity of the proposed structure and the standard or prior art parallel structure for a number of example filters.

DETAILED DESCRIPTION

Sample rate converters are a special class of multirate FIR filters. Two main types of sample rate converters exist: interpolators and decimators. Since a decimator can easily be obtained by transposing the signal flow graph of an interpolator [14], the discussion which follows concentrates on interpolators.

The polyphase decompostion of a single-input 1-to-M interpolator [15] is expressed in the z-domain as shown below.

$$Y(z) = H(z)X(z^M) \qquad (13)$$

$$= \sum_{i=0}^{M-1} z^{-i} H_i(z^M) X(z^M) = \sum_{i=0}^{M-1} z^{-i} Y_i(z^M),$$

where $$H_i(z^M) = \sum_{j=0}^{K-1} h_{i+jN} z^{-jM}$$

for N=KM. If the interpolator receives more than one input sample on every clock cycle, a specialized filter structure is required for the implementation. This paper proposes an FFA-based architecture that reduces the multiplier and adder requirements for symmetrical FIR sample rate converters. In the case of an L-parallel 1-to-M FFA based interpolator, the structure is developed as follows:

Step 1: Apply the polyphase decomposition technique described by equation (13) to the FIR interpolator. This decomposition results in M polyphase subfilters.

Step 2: Apply an L-by-L FFA decomposition to each polyphase subfilter, thereby breaking it down into multiple FFA subfilters (also referred to herein as sub-sub-filters).

Step 3: Since each polyphase subfilter receives the same L-parallel input data, only one copy of the FFA pre-add section is required, as shown in FIG. 2c. M−1 redundant copies of the pre-add structure may be removed. Note that M copies of the post-add structure are required, one for each polyphase subfilter.

The first optimization, which may be used to reduce the total number of multipliers required to implement the filter, will be introduced through an example.

Consider the construction of a 2-parallel version of a 1-to-2 interpolator using the procedure described above. In this example, the symmetrical interpolation filter is 16 taps long, with the coefficients defined as $h_0$, $h_1$, ..., $h_7$, $h_7$, $h_6$, ..., $h_0$. Performing a polyphase decomposition will result in two polyphase subfilters, $H_0$ and $H_1$, which will contain the odd and even coefficients of the original prototype filter, respectively. Since two input samples are received every clock cycle, the 2-by-2 T&C FFA is applied to decompose each polyphase subfilter $H_i$, into three 4-tap FFA subfilters ($H_{i,j}$), where i represents the polyphase subfilter numbering and j represents the FFA subfilter numbering.

Figure 1A:
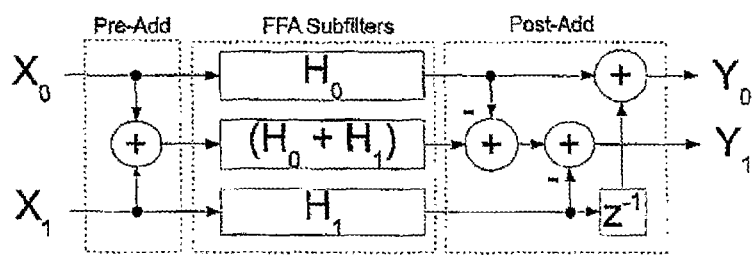
FIG. 1A is an illustration of a standard or prior art 2×2 filter having a FFA structure.
Figure 1B:
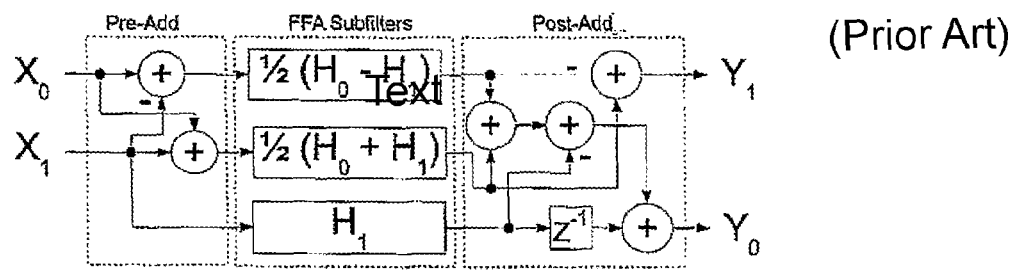
FIG. 1B is an illustration of a standard or prior art 2×2 filter having a T&C FFA structure.
Figure 2A:
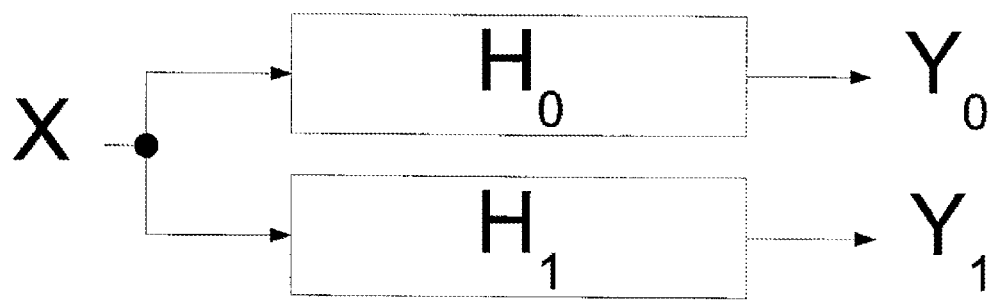
FIG. 2A is an illustration of a standard or prior art polyphase upsample by 2 filter.
Figure 2B:
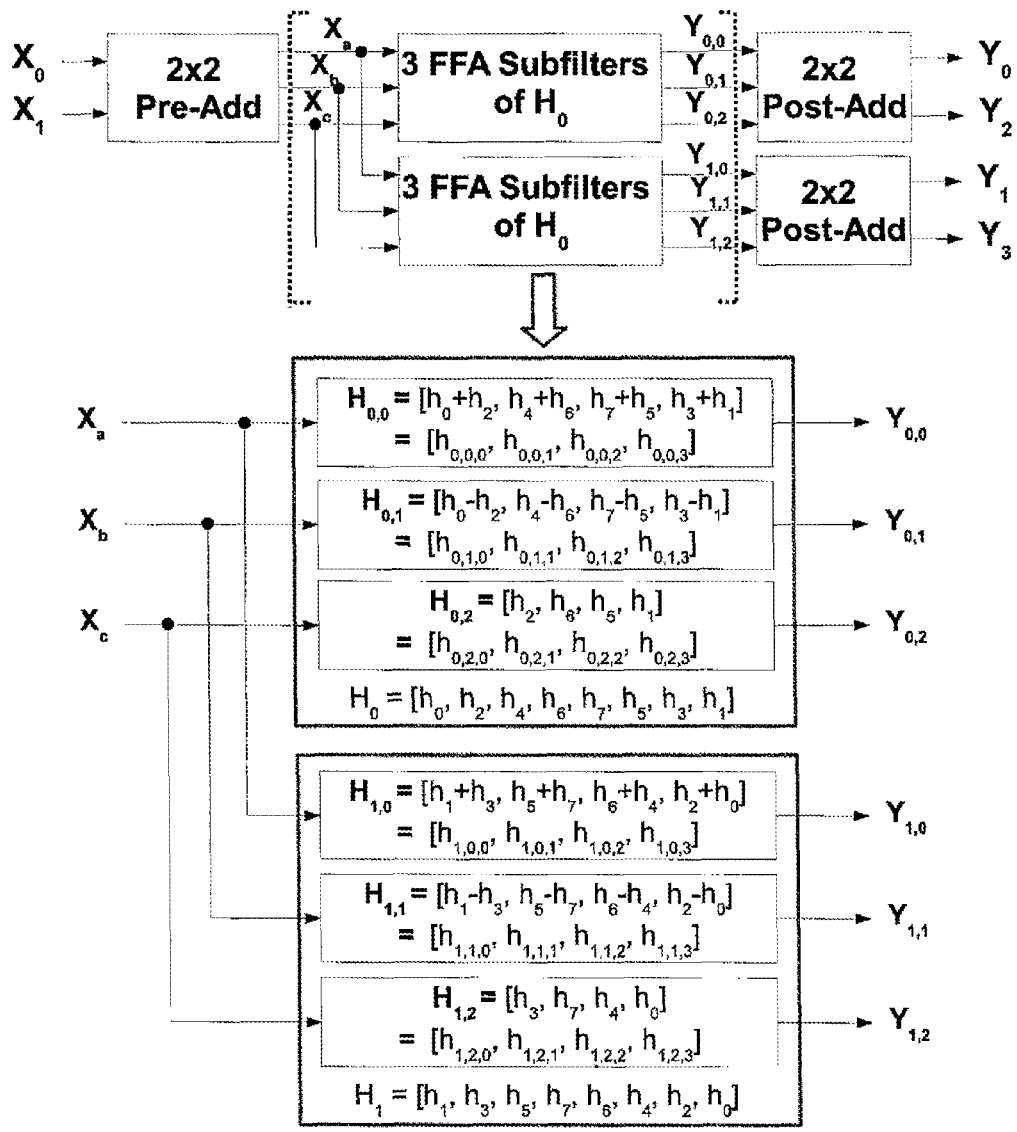
FIG. 2B is an illustration of a 2×2 FFA upsample by 2 filter which clearly shows the coefficents of the individual sub-subfilters.
Figure 2C:
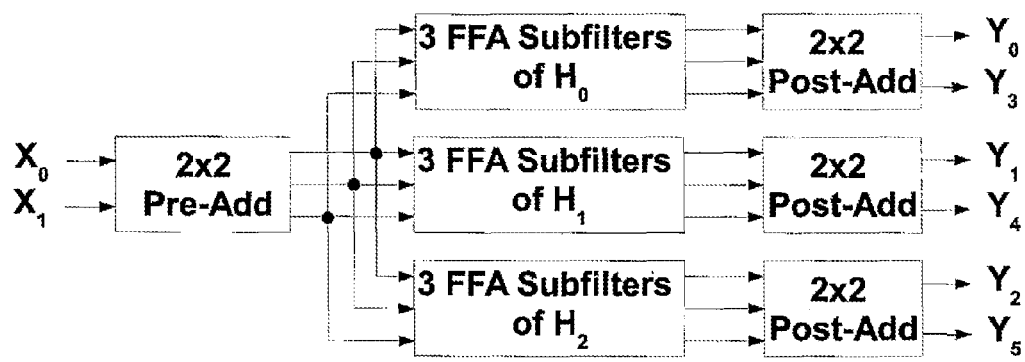
FIG. 2C is an illustration of a 2×2 FFA upsample by 3 filter.

FIG. 2b shows the coefficients of the 4-tap FFA subfilters, which are represented as $h_{i,j,0}$, ..., $h_{i,j,3}$. It can be seen from the figure that none of the FFA subfilters is symmetrical. However, FFA subfilters $H_{0,0}$ and $H_{1,0}$ contain the same set of coefficents but in the opposite order ($h_{0,0,0}=h_{0,0,3}$, ..., $h_{0,0,3}=h_{1,0,0}$). Furthermore, these two subfilters take the exact same input (shown as $X_a$ in the figure). In [15], Mou showed that it is possible to exploit this centrosymmetry as follows in order to implement the two filters using four multipliers and eight adders, instead of the eight multipliers and six adders required by the straightforward implementation.

$$\begin{bmatrix} Y_{0,0}(n) \\ Y_{1,0}(n) \end{bmatrix} = \begin{bmatrix} H_{0,0} \\ H_{1,0} \end{bmatrix} X_a \quad (14)$$

$$= \begin{bmatrix} h_{0,0,0} & h_{0,0,1} & h_{0,0,2} & h_{0,0,3} \\ h_{1,0,0} & h_{1,0,1} & h_{1,0,2} & h_{1,0,3} \end{bmatrix} \begin{bmatrix} x_{a,n} + x_{a,n-3} \\ x_{a,n-1} + x_{a,n-2} \\ x_{a,n-1} - x_{a,n-2} \\ x_{a,n} - x_{a,n-3} \end{bmatrix}$$

$$= A \begin{bmatrix} c_0 & c_1 & 0 & 0 \\ 0 & 0 & d_0 & d_1 \end{bmatrix} \begin{bmatrix} I_2 & J_2 \\ J_2 & -I_2 \end{bmatrix} \begin{bmatrix} x_{a,n} \\ x_{a,n-1} \\ x_{a,n-2} \\ x_{a,n-3} \end{bmatrix} \quad (15)$$

$$= A \begin{bmatrix} c_0 & c_1 & 0 & 0 \\ 0 & 0 & d_0 & d_1 \end{bmatrix} DX_a \quad (16)$$

where $$A = \begin{bmatrix} 1 & 1 \\ 1 & -1 \end{bmatrix},$$

$c_i=(H_{0,0}[i]+H_{1,0}[i])/2$, $d_i=(H_{0,0}[i]-H_{1,0}[i])/2$ and $I_2$ and $J_2$ represent the 2-by-2 identity and counter identity matrices, respectively. Notice that the original filtering operations have been broken down into a set of pre-filtering combining adders (represented by matrix D), a simpler filtering operation, and a set of post-filtering separating adders (represented by matrix A).

Similarly, the coefficients used by FFA subfilter $H_{1,1}$ are the reversed and negated versions of those used by $H_{0,1}$. This subfilter pair may also be computed using equation (15) with the following minor substitution:

$$A = \begin{bmatrix} 1 & 1 \\ -1 & 1 \end{bmatrix}.$$

Note that the subfilters $H_{0,2}$ and $H_{1,2}$ are not symmetrical, so they must be implemented using one multiplier per coefficient.

Next, consider the case of a 2-parallel 1-to-3 FFA-based interpolator, as shown in FIG. 2c. If the FFA subfilter coefficients are explicitly decomposed as was done in FIG. 2b for the 1-to-2 case, it will be apparent that some centrosymmetric FFA subfilter pairs exist between the polyphase subfilters $H_0$ and $H_2$. Additionally, some of the FFA subfilters arising from interpolator subfilter $H_1$ are individually symmetrical, and may therefore be implemented in the typical way to reduce the multiplier usage by half.

In general, for any L-by-L FFA based symmetrical interpolator or decimator, centro-symmetric FFA subfilter pairs exist between the T&C FFAs of the polyphase subfilters $H_i$ and $H_{M+1-i}$, where i=1, 2, ..., $\lfloor M/2 \rfloor-1$. If M is odd, the polyphase subfilter $H_{(M-1)/2+1}$ will generate some symmetrical FFA subfilters. By exploiting both forms of symmetry, it is possible to reduce the multiplier cost of multirate FFA implementations. Note that a derivation of the multiplier costs of various composite FFAs is provided hereinafter.

Figure 3A:
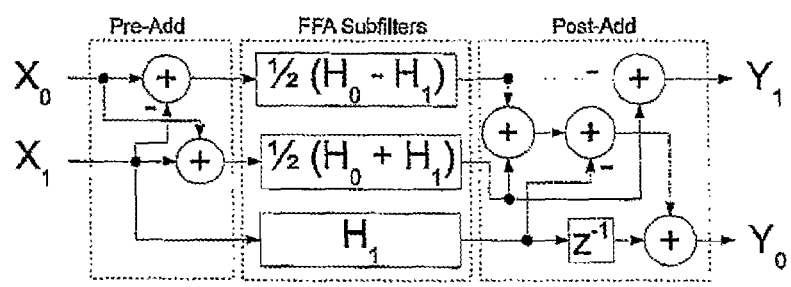
FIG. 3A is an illustration of a standard or prior art 2×2 filter having a T&C FFA structure.
Figure 3B:
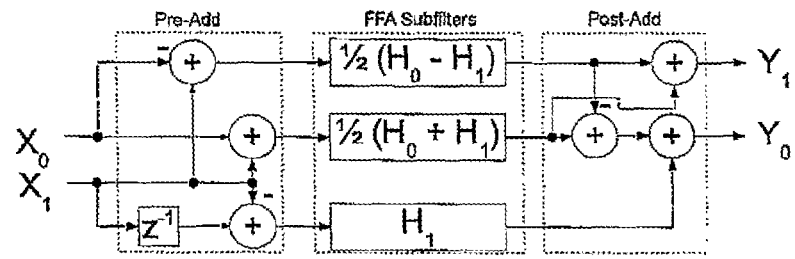
FIG. 3B is an illustration of a 2×2 filter having a transposed T&C FFA structure.

It is well-known [14] that if the signal flow graph of a single-rate linear system is transposed, the functionality of the system is unchanged. This process can be applied to any FFA decomposition in order to generate an alternate structure. For example, consider FIGS. 3a and 3b, which show the 2×2 T&C FFA in the normal and transposed formats. Although these two systems are functionally identical, they clearly use different pre and post adder structures. It is apparent from FIG. 3 that the typical 2×2 T&C FFA requires 2 pre adders and 4 post adders, whereas the transposed structure requires 3 pre adders and 3 post adders.

In general, the effect of transposition on an FFA is to transfer some of the adders from the post adder structure into the pre adder structure. Table 1 summarizes the pre and post adder requirements for a variety of FFA structures. Note that the FFA subfilters are unaffected by transposition.

Figure 4A:
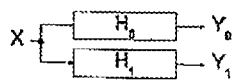
FIG. 4A is an illustration of a standard or prior art polyphase upsample by 2 filter.
Figure 4B:
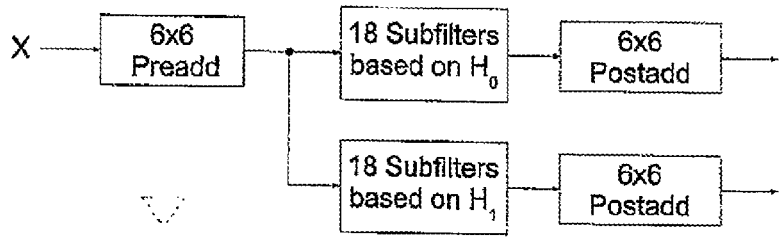
FIG. 4B is an illustration of a 6×6 FFA upsample by 2 filter.
Figure 4B:
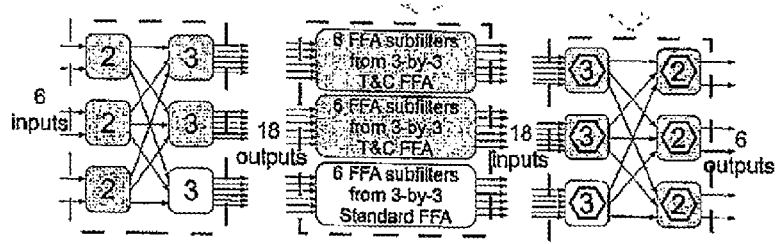

It is apparent from Table 1 that transposition does not change the logic resources required to implement a single rate FFA, as the increase in pre adder resources is exactly balanced by a decrease in post adder resources. However, this is not the case for multirate FFAs. To illustrate this fact, consider the case of a 1-to-2 interpolator with 6 parallel inputs, shown in FIG. 4. After each of the polyphase subfilters from FIG. 4a is converted into a 6×6 FFA, the interpolator requires 2 copies of the 6×6 post adder structure, but only one copy of the 6×6 pre adder structure, as indicated in FIG. 4b. The 6×6 pre and post adders themselves require three copies of the 2×2 T&C structure, two copies of the 3×3 T&C structure, and one copy of the standard 3×3 structure. Referring to Table 1 for the individual costs, the total number of pre and post adders required if non-transposed structures are used is 105. If the transposed structures are used instead for the individual FFAs, only 93 pre and post adders are needed, representing a cost reduction of 12 adders.

Figure 4C:
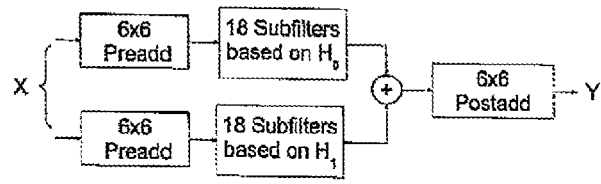
FIG. 4C is an illustration of a 6×6 FFA downsample by 2 filter.

In general, 1-to-M interpolators require M copies of the post adder structure and only 1 copy of the pre adder structure. As a result, the most economical implementation for an interpolator is achieved through the transposed architecture, which transfers some of the complexity from the post adder structure to the pre adder structure. Conversely, the non-transposed architectures result in more economical implementations for decimators, due to the fact that M-to-1 decimators require M copies of the pre adder structure and only 1 copy of the post adder structure, as indicated in FIG. 4c. The number of adders saved by using the optimal transpostion increases as the rate change factor M and the parallelism L increase.

When transposition is performed, the updated pre and post adder matrices may be found through the following procedure:
1) Set post adder matrix to transpose of original pre adder matrix
2) Set pre adder matrix to transpose of original post adder matrix
3) Reverse order of rows in post adder matrix
4) Reverse order of columns in pre adder matrix An L-parallel 1-to-M FFA interpolator may be represented mathematically as follows:

$$Y_p = \begin{bmatrix} Y_{p,0} \\ Y_{p,1} \\ \dots \\ Y_{p,M-1} \end{bmatrix} = \begin{bmatrix} Q_c \\ Q_c \\ \dots \\ Q_c \end{bmatrix} \text{diag} \begin{bmatrix} H_{c,0} \\ H_{c,1} \\ \dots \\ H_{c,M-1} \end{bmatrix} P_c X_p \quad (17)$$

where M is the upsmapling factor, $Q_c$ is the post-adder matrix of an L-by-L FFA, $Y_{p,i}$ is a permuted version of the output of an L-by-L FFA performed on the $i^{th}$ polyphase subfilter, $H_{c,i}$ is an L-by-L FFA subfilter matrix derived from the $i^{th}$ polyphase subfilter, $P_c$ is the pre-adder matrix of an L-by-L FFA and $X_p$ is the permuted version of the input of the L-by-L FFA or FFA interpolator.

The derivation of each of these quantities is described in detail in the following sections.

1) Derive Pre-Add Matrix:

As shown in equation 10, the pre-adder matrix of a composite L-by-L standard FFA is constructed by forming the tensor product of the pre-adder matrices of each of the elementary (2-by-2 or 3-by-3) FFAs. However, the expression for the pre-adder matrix of an L-by-L T&C FFA is more complex.

To illustrate, consider a 6-by-6 FFA implemented by cascading 2-by-2 and 3-by-3 FFAs. The pre-adder matrix for a 6-by-6 was developed hereinbefore, and is shown in equation 19. In the case of a symmetrical filter, the 6-by-6 T&C FFA is developed as follows.

The first cascading stage of 6-by-6 T&C FFA involves a 2-by-2 T&C FFA, which breaks down the original filter into two symmetrical and one non-symmetrical FFA subfilters. The second stage of the decomposition involves using a 3-by-3 FFA to further decompose each of the subfilters from the first stage. When decomposing the symmetrical subfilters, the T&C FFA is used. However, since one of the subfilters is not symmetrical, it will not yield any symmetrical subfilters when decomposed. Therefore, it is preferable to use the less expensive standard FFA when decomposing the non-symmetrical filter.

In order to derive an expression for the 6-by-6 T&C FFA, it is useful to note that the first two rows of the pre-adder matrix $p_{c,2}$ generate inputs for the symmetrical subfilters, whereas the third row generates an input for the non-symmetrical subfilter. Since these two sets of subfilters are to be decomposed in different ways, a technique for mathematically separating the rows of $p_{c,2}$ is needed. This paper introduces two new matrices for this purpose: $S_{c,2}$=diag[1 1 0] extracts the rows which correspond to symmetrical subfilters, and $S_{s,2}$=diag[0 0 1] extracts the rows which correspond to non-symmetrical subfilters. Similarly, two other matrices $S_{c,3}$=diag[0 0 1 1 1 1] and $S_{s,3}$=[1 1 0 0 0 0] are introduced to extract the rows from $p_{c,3}$ related to symmetrical and non-symmetrical 3-by-3 T&C FFA subfilters, respectively. The 6-by-6 T&C pre-adder matrix is generated by applying the T&C 3-by-3 FFA to the symmetrical portion of $p_{c,2}$ and the standard 3-by-3 FFA to the non-symmetrical portion of $p_{c,2}$, as shown in equation 18.

$$P_{c,6}=[S_{s,2} \times p_{c,2}] \otimes p_{c,3}+[S_{n,2} \times p_{c,2}] \otimes p_{s,3} \quad (18)$$

$$P_{s,6}=p_{c,2} \otimes p_{s,3} \quad (19)$$

Figure 5:
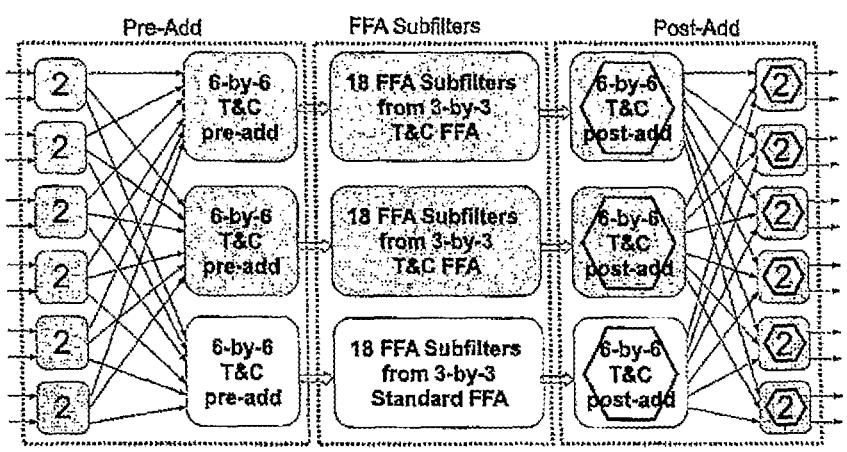
FIG. 5 is an illustration of a 12×12 filter having a T&C FFA structure.

Extending the example one step further, a 12-by-12 FFA may be viewed as a cascade of 2-by-2 and 6-by-6 FFAs as shown in FIG. 5. As in the previous example, after performing the initial 2-by-2 decomposition, one of the subfilters is non-symmetrical, and is therefore best suited to a standard FFA decomposition. Thus, as shown in equation 20, the derivation of a 12-by-12 T&C FFA requires both the 6-by-6 standard and T&C FFAs. A graphical representation of the filter structure is provided in FIG. 5.

$$P_{c,12}=[S_{s,2} \times p_{c,2}] \otimes P_{c,6}+[S_{n,2} \times p_{c,2}] \otimes P_{s,6} \quad (20)$$

In general, the derivation of the pre-adder matrix for a composite T&C FFA involves an iterative process that starts from the final cascading stage, W−1. The first step of the iterative process defines the T&C pre-adder matrix $P_{c,l_{W-1}}$ and standard pre-adder matrix $P_{s,l_{W-1}}$ as shown in equation 21.

$$P_{c,l_{W-1}}=p_{c,l_{W-1}} \text{ and } P_{s,l_{W-1}}=p_{s,l_{W-1}} \quad (21)$$

For the subsequent iterations, j=W−2, W−3, . . . , 0, the pre-adder matrices of both b-by-b T&C and standard FFAs, where b=$\Pi_{i=j}^{W-1} l_i$ are computed as shown in equations 22 and 23, respectively.

$$P_{c,b}=[S_{c,l_j} \times p_{c,l_j}] \otimes P_{c,b'}+[(S_{n,l_j} \times p_{c,l_j}] \otimes P_{s,b'}, \quad (22)$$

$$P_{s,b}=P_{s,l_j} \otimes p_{s,l_{j+1}} \otimes \dots p_{s,l_{W-2}} \otimes p_{s,l_{W-1}} \quad (23)$$

where b'=b/$l_j$. The final pre-adder matrix, $P_c$, is equal to $P_{c,L}$.

2) Derive Subfilter Matrix:

The subfilter matrix $H_{c,m}$, for m=0, 1, . . . , M−1, which represents the FFA subfilters of $m^{th}$ polyphase subfilter H, is given as $$H_{c,m}=G_c \times P_c \times H_m, \quad (24)$$

where $G_c$ is the gain of the FFA.

The gain matrix $G_c$ is derived through the same iterative process used to derive the pre-adder matrix, explained in −1. The first iterative step, j=W−1, starts with gain matrices of both T&C and standard FFAs from the final cascading stage, as given below.

$$G_{c,l_{W-1}}=g_{c,l_{W-1}} \text{ and } G_{s,l_{W-1}}=g_{s,l_{W-1}} \quad (25)$$

For the subsequent iterations, j=W−2, W−3, . . . , 0 the gain matrices of both b-by-b standard and T&C sections are determined using equations 26 and 27.

$$G_{s,b}=g_{s,l_j} \otimes g_{s,l_{j+1}} \otimes \dots g_{s,l_{W-2}} \otimes g_{s,l_{W-1}} \quad (26)$$

$$G_{c,b}=[S_{c,l_j} \times g_{c,l_j}] \otimes G_{c,b'}+[(S_{n,l_j} \times g_{c,l_j}] \otimes G_{s,b'}, \quad (27)$$

The final gain matrix, $G_c$, is equal to $G_{c,L}$.

3) Derive Post-Add Matrix:

The procedure for computing the post-adder for a composite standard FFA was previously provided in equation 12.

Applying this procedure to a 6-by-6 standard FFA yields the result shown in equation 28 below.

$$Q_{s,6}=B_{s,1}^{(6)} \times B_{s,0}^{(6)}, \text{ where} \tag{28}$$

$$B_{s,0}^{(6)}=I_3 \otimes q_{s,3} \tag{29}$$

$$B_{s,1}^{(6)}=Q_{s,2}^{(6)}, \tag{30}$$

where $Q_{s,2}^6$ is generated by performing a 3-by-3 delay unfolding transformation on matrix $q_{s,2}$. Note that in this section, the superscript $^{(x)}$ is used to indicate that the matrix in question belongs to an x-by-x FFA, and does not imply any mathematical operations. Thus, the matrix $B_{s,0}^{(6)}$ is identical to the matrix $B_{s,0}$. This superscript notation is used only to clarify the examples discussed in this section, and is not used for generalized L-by-L FFA derivation which follows.

The derivation of 6-by-6 T&C post-add matrix is more complex because both the T&C and standard post-add matrices are involved. As shown in FIG. 4b, the overall post-adder structure for this filter may be broken up into two stages. The first stage of post-adders connects directly to the 18 FFA subfilters and corresponds to the final (3-by-3) stage of the cascaded FFA decomposition. The first two sets of 6 subfilters were generated by applying the 3-by-3 T&C FFA to two symmetrical subfilters from the first cascading stage, so the corresponding post-adders use the T&C structure. The final set of 6 subfilters was generated by applying the 3-by-3 standard FFA to the non-symmetrical subfilter from the first cascading stage, so its post adder uses the standard FFA structure. The output of the first stage of the post-add section is represented mathematically as shown in Equation 32. In the second post-adder stage, which is represented by equation 33, the output of the 3-by-3 post-adder structures are connected to three 2-by-2 T&C post-adder structures.

$$Q_{c,6}=B_{c,1}^{(6)} \times B_{c,0}^{(6)}, \text{ where} \tag{31}$$

$$B_{c,0}^{(6)}=(S_{c,2} \otimes q_{c,3})+(S_{s,2} \otimes q_{s,3}) \tag{32}$$

$$B_{c,1}^{(6)}=Q_{c,2}^{(6)}, \tag{33}$$

where $Q_{c,2}^{(6)}$ is generated by performing a 3-by-3 delay unfolding transformation on $q_{c,2}$.

The 12-by-12 post-add matrices of standard and T&C FFAs are given in equations 34 and 38 respectively.

$$Q_{s,12}=B_{s,2}^{(12)} \times B_{s,1}^{(12)} \times B_{s,0}^{(12)}, \text{ where} \tag{34}$$

$$B_{s,0}^{(12)}=I_3 \otimes (I_3 \otimes q_{s,3})=I_3 \otimes B_{s,0}^{(6)} \tag{35}$$

$$B_{s,1}^{(12)}=I_3 \otimes Q_{s,2}^{(6)} \tag{36}$$

$$B_{s,2}=Q_{s,2}^{(12)} \tag{37}$$

where $Q_{s,2}^{(12)}$ is generated by performing a 6-by-6 delay unfolding transformation on $q_{s,2}$.

$$Q_{c,12}=B_{c,2}^{(12)} \times B_{c,1}^{(12)} \times B_{c,0}^{(12)}, \text{ where} \tag{38}$$

$$B_{c,0}^{(12)}=(S_{c,2} \otimes B_{c,0}^{(6)})+(S_{s,2} \otimes B_{s,0}^{(6)}) \tag{39}$$

$$B_{c,1}^{(12)}=(S_{c,2} \otimes Q_{c,2}^{(6)})+(S_{s,2} \otimes Q_{s,2}^{(6)}) \tag{40}$$

$$B_{c,2}^{(12)}=Q_{c,2}^{(12)} \tag{41}$$

where $Q_{c,2}^{(12)}$ is generated by performing a 6-by-6 delay unfolding transformation on $q_{c,2}$.

The derivation of generalized L-by-L T&C post-add matrix $Q_c$ is expressed as $$Q_c = \prod_{i=0}^{W-1} B_{c,W-1-i}, \tag{42}$$

where $B_{c,W-1-i}$ is derived below. From the above examples, it is clear that the derivation of $B_{c,W-1-i}$ involves an iterative process.

The first iterative step (j=0) defines two matrices $B_{c,i,j}=Q_{c,l_i}$ and $B_{s,i,j}=Q_{s,l_i}$, where $Q_{c,l_i}$ and $Q_{s,l_i}$ are generated by performing $L/(\Pi_{n=0}^{i} l_n)$-by-$L/(\Pi_{n=0}^{i} l_n)$ delay unfolding transfor-mations on matrices $q_{c,l_i}$ and $(q_{s,l_i})$, respectively.

The subsequent iterative steps (j=1, . . . , i) are defined as follows.

$$B_{c,i,j}=(S_{c,l_{i-j}} \otimes B_{c,i,j-1})+(S_{n,l_{i-j}} \otimes B_{s,i,j-1}), \tag{43}$$

In eqn (43), $B_{s,i,j-1}$ is obtained as given below.

$$B_{s,i,j}=I_{F_j} \otimes B_{s,i,j-1}, \tag{44}$$

where $F_j=3$ for $l_{i-j}=2$ and $F_j=6$ for $l_{i-j}=3$. The matrix $B_{c,W-1-i}$ is equal to $B_{c,i,i}$ The resource usage of the proposed technique may be analyzed in three main sections: the subfilters, the polyphase combiner adders (in the case of a decimator), and the FFA pre/post adders. Considering the subfilters first, when a multirate filter is implemented using the proposed scheme, the total number of subfilters may be determined as follows:

$$F = M \prod_{i=1}^{W} F_i \tag{45}$$

where $F_i$, the number of subfilters generated by the i'th FFA, is 3 for a 2×2 FFA and 6 for a 3×3 FFA. Each of the subfilters has N/LM coefficents. Of these subfilters, a fraction equal to $(2/3)^W$ are either individually symmetric or jointly centrosymmetric, with the remainder being asymmetric. As previously discussed, it is possible to exploit either type of symmetry in order to reduce the required multiplier resources by half. Thus, the total number of multipliers required to implement the filter is:

$$P = \left(\frac{2}{3}\right)^W \frac{N}{2L} \prod_{i=1}^{W} F_i + \left(1-\left(\frac{2}{3}\right)^W\right) \frac{N}{L} \prod_{i=1}^{W} F_i \tag{46}$$

The number of adders typically required to implement an FIR subfilter is one less than the number of filter coefficients. In order to exploit the symmetry in the jointly centrosymmetric subfilters, one additional adder is required per subfilter. Thus, the total number of adders required for the subfilters is:

$$A_{sf} = \left(\frac{N}{LM}-1+\left(\frac{2}{3}\right)^W\right) M \prod_{i=1}^{W} F_i \tag{47}$$

In the case of a decimator, the most efficient implementation is generated by placing the adders associated with the polyphase combiner right after the subfilters and before the FFA post adders, as shown in FIG. 4c. In this case, the required number of polyphase combiner adders is:

$$A_{pph} = \left(\frac{M-1}{M}\right)\left(M\prod_{i=1}^{W} F_i\right) = (M-1)\prod_{i=1}^{W} F_i \quad (48)$$

When constructing a single-rate composite FFA larger than 2×2 or 3×3, multiple copies of the standard 2×2 or 3×3 pre and post adder structures are required. The exact number of copies depends on the sequence of FFA decompositions used to construct the composite filter. At each stage of the decomposition, $C_i$, the number of copies required, may be determined based on the number of inputs to the pre adder stage as follows:

$$C_i = \frac{L}{L_i}\left(\prod_{k=1}^{i-1} \frac{F_k}{L_k}\right) \quad (49)$$

As previously discussed, the T&C FFA structure is used when decomposing filters that are symmetric or jointly centrosymmetric, while the standard FFA decomposition is used for asymmetric filters. Thus, the fraction of the pre and post adder copies which use the T&C structure in the i'th stage of the FFA decomposition is $\frac{2}{3}^{i-1}$. The standard FFA structure is used for the remaining copies.

For multirate FFA structures, the total pre and post adder cost depends on whether the filter is an interpolator or a decimator. M copies of the pre adder structure are required for decimators, while M copies of the post adder structure are required for interpolators. Thus, the required numbers of pre and post adders for the proposed interpolator and decimator structures are given by equations 50 and 51, respectively:

$$A_{ffa\_int} = \sum_{i=1}^{r} C_i\left[(2/3)^{i-1}(A_{C\_pre_i} + MA_{C\_post_i}) + \right. \quad (50)$$
$$\left. (1-(2/3)^{i-1})(A_{S_{pre_i}} + MA_{S\_post_i})\right]$$

$$A_{ffa\_dec} = \sum_{i=1}^{r} C_i\left[(2/3)^{i-1}(MA_{C\_pre_i} + A_{C\_post_i}) + \right. \quad (51)$$
$$\left. (1-(2/3)^{i-1})(MA_{S_{pre_i}} + A_{S\_post_i})\right]$$

where $A_{S\_pre_i}$, $A_{S\_post_i}$, $A_{C\_pre_i}$, and $A_{C\_post_i}$ refer to the number of adders in the standard/T&C pre/post adder structure used for the FFA decomposition at stage i. These values are listed in Table 1.

The typical way to implement a multirate filter at sampling rates higher than the system clock rate is to extend the parallel filtering approach described in [6]. Such an approach would involve breaking down each of the M polyphase filter branches into $L^2$ subfilters. Since each pair of subfilters is jointly centrosymmetric in this case, the total number of multipliers required is $$\frac{NL}{2}.$$

The total number of adders required is NL-LM for interpolators and NL-L for decimators.

Table 2 compares the required computational resources of the parallel and proposed techniques for a variety of multirate filters. Note that in the "Saved Adders" column, the number without parentheses represents the total difference between the proposed approach and the parallel approach, whereas the number in parentheses represents the saving achieved by using the optimized transposed architecture.

Figure 6:
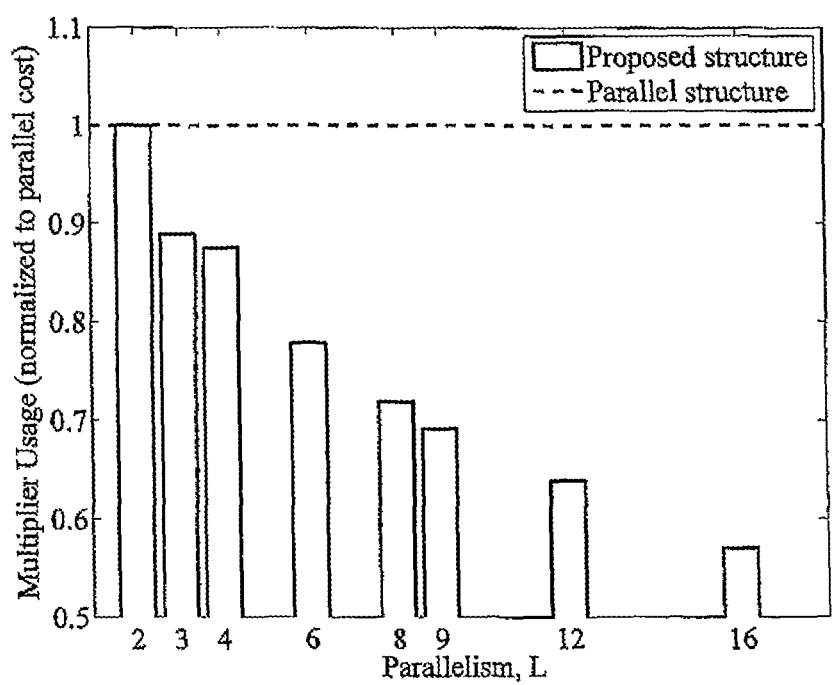
FIG. 6 is an illustration comparing the multiplier usage of the proposed structure to that of the standard or prior art parallel structure for a variety of parallelism factors.

It is clear from equation 46 and Table 2 that the number of multipliers saved by the proposed approach does not depend on the rate change factor M. Rather, the multiplier savings are determined solely by the parallelism factor L. As the parallelism increases, the multiplier savings relative to the parallel case also increases, as highlighted in FIG. 6. Thus, higher levels of parallelism are desirable from a resource utilization perspective, although there is a tradeoff in terms of increased design complexity.

It should be noted that the proposed approach is not limited to cases where the signal's sampling frequency exceeds the system clock frequency. In situations where the converse is true, this technique may be applied in order to trade logic resource consumption or chip area for a reduction in dynamic power consumption. The application of the proposed technique will reduce the operating rate of the multipliers, thereby requiring more discrete multipliers in order to perform the operation. However, the total number of multiplications performed by the system per unit of time will be reduced according to the relationship shown in FIG. 6, resulting in a corresponding reduction in the dynamic power consumed by the module.

The arrangements herein provide a technique for applying Fast-FIR filtering to upsampling and downsampling filters, resulting in a reduction in the computational complexity and hardware implementation costs of such filters. The technique allows for the exploitation of symmetry in the prototype filter coefficients, which allows for a further reduction in the number of multipliers required to construct the filters.

The structure and computational complexity of the derived multirate Fast FIR filters may be modified by transposing the signal flow graphs of the individual Fast-FIR decompositions, allowing some duplicate pre- and post-adder sections to be combined. In the case of an upsampler, the transposed version of the filter results in a more economical hardware implementation. Conversely, the non-transposed filter structure is more economical for downsamplers.

Furthermore, the arrangements herein provide a series of generalized equations describing the operation of the symmetrical FIR exploitation scheme originally presented by T&C and utilized in the present technique. Such equations were not previously available in the public literature. These equations simplify the application of the T&C FIR technique for arbitrary numbers of parallel inputs.

The invention claimed is:

1. A method for filtering data samples comprising:
   using a digital filter to act upon a input data stream in order to transform it into an output data stream, wherein:
   the length of an impulse response of the digital filter is finite;
   an impulse response of the digital filter is symmetric;
   the operation of the digital filter is multi-rate;
   using a polyphase decomposition to break down the input data stream into N parallel substreams;
   the multi-rate digital filter being separated by a polyphase decomposition into multiple lower-rate sub-filters;

each of the sub-filters being separated one or more times into a set of simpler sub-sub-filters, a set of pre-filtering arithmetic structures, and a set of post-filtering arithmetic structures, according to a fast FIR filtering decomposition algorithm;

the set of sub-sub-filters comprising one or more pairs of sub-sub-filters which operate upon the same set of input samples and which have impulse responses which are jointly centro-symmetric;

and performing each such pair of sub-sub-filtering operations using a single shared filter structure, a set of pre-filtering combining adders, and a set of post-filtering separating adders.

2. The method according to claim 1, wherein the multi-rate digital filter is
a digital interpolator and wherein a single pre-filtering arithmetic structure is used to generate the set of input data samples required by multiple sets of sub-sub-filters.

3. The method according to claim 2, wherein the order of the pre-filtering and post-filtering arithmetic structures is interchanged through a circuit transposition operation.

4. The method according to claim 1, wherein the filter is a digital decimator and a single post-filtering arithmetic structure is used to process the output samples from Multiple sets of sub-sub-filters.

5. The method according to claim 4, wherein the order of the pre-filtering and post-filtering arithmetic structures is interchanged through a circuit transposition operation.

6. The method according to claim 1, wherein the fast FIR decomposition algorithm is a 2×2 decomposition as described in equation 6.

7. The method according to claim 1, wherein the fast FIR decomposition algorithm is a 3×3 decomposition as described in equation 8.

8. A method for filtering data samples comprising:
using a digital filter to act upon a input data stream in order to transform it into an output data stream, wherein:
the length of an impulse response of the digital filter is finite;
an impulse response of the digital filter is symmetric;
the operation of the digital filter is multi-rate;
using a polyphase decomposition to break down the input data stream into N parallel substreams;
the multi-rate digital filter being separated by a polyphase decomposition into multiple lower-rate sub-filters;
each of the sub-filters being separated one or more times into a set of simpler sub-sub-filters, a set of pre-filtering arithmetic structures, and a set of post-filtering arithmetic structures, according to a fast FIR filtering decomposition algorithm;
wherein the multi-rate digital filter is a digital interpolator and wherein a single pre-filtering arithmetic structure is used to generate the set of input data samples required by multiple sets of sub-sub-filters.

9. The method according to claim 8, wherein the order of the pre-filtering and post-filtering arithmetic structures is interchanged through a circuit transposition operation.

10. The method according to claim 8, wherein the fast FIR decomposition algorithm is a 2×2 decomposition as described in equation 6.

11. The method according to claim 8, wherein the fast FIR decomposition algorithm is a 3×3 decomposition as described in equation 8.

12. A method for filtering data samples comprising:
using a digital filter to act upon a input data stream in order to transform it into an output data stream, wherein:
the length of an impulse response of the digital filter is finite;
an impulse response of the digital filter is symmetric;
the operation of the digital filter is multi-rate;
using a polyphase decomposition to break down the input data stream into N parallel substreams;
the multi-rate digital filter being separated by a polyphase decomposition into multiple lower-rate sub-filters;
each of the sub-filters being separated one or more times into a set of simpler sub-sub-filters, a set of pre-filtering arithmetic structures, and a set of post-filtering arithmetic structures, according to a fast FIR filtering decomposition algorithm;
wherein the filter is a digital decimator and a single post-filtering arithmetic structure is used to process the output samples from multiple sets of sub-sub-filters.

13. The method according to claim 12, wherein the order of the pre-filtering and post-filtering arithmetic structures is interchanged through a circuit transposition operation.

14. The method according to claim 12, wherein the fast FIR decomposition algorithm is a 2×2 decomposition as described in equation 6.

15. The method according to claim 12, wherein the fast FIR decomposition algorithm is a 3×3 decomposition as described in equation 8.

* * * * *